United States Patent
Bernstein et al.

(10) Patent No.: US 7,605,429 B2
(45) Date of Patent: Oct. 20, 2009

(54) HYBRID CRYSTAL ORIENTATION CMOS STRUCTURE FOR ADAPTIVE WELL BIASING AND FOR POWER AND PERFORMANCE ENHANCEMENT

(75) Inventors: Kerry Bernstein, Underhill, VT (US); Jeffrey W. Sleight, Ridgefield, CT (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/107,611

(22) Filed: Apr. 15, 2005

(65) Prior Publication Data
US 2006/0231893 A1    Oct. 19, 2006

(51) Int. Cl.
*H01L 29/72* (2006.01)
(52) U.S. Cl. .............. 257/347; 257/351; 257/371; 257/510
(58) Field of Classification Search ............ 257/347, 257/351, 371, 510
See application file for complete search history.

(56) References Cited

U.S. PATENT DOCUMENTS

| | | | |
|---|---|---|---|
| 5,384,473 A | 1/1995 | Yoshikawa et al. | |
| 5,985,708 A * | 11/1999 | Nakagawa et al. | 438/206 |
| 6,337,253 B1 | 1/2002 | Davari et al. | |
| 6,864,104 B2 | 3/2005 | King | |
| 2002/0115244 A1 * | 8/2002 | Park et al. | 438/152 |
| 2003/0151112 A1 * | 8/2003 | Yamada et al. | 257/510 |
| 2005/0202600 A1 * | 9/2005 | Yamashita | 438/149 |
| 2006/0249759 A1 * | 11/2006 | Morris | 257/286 |

FOREIGN PATENT DOCUMENTS

WO    2004114400    12/2004

OTHER PUBLICATIONS

M. Yang, et al., "High-Performance CMOS SOI Devices on Hybrid Crystal Oriented Substrates". IEDM 2003.
J. Tschanz, et al. "Adaptive Body Bias For Reducing Impacts of Die-to-Die and Within-Die Parameter Variations on Microprocessor Frequency and Leakage" IEEE Journal of Solid-State Circuits, vol. 37, No. 11, pp. 1396-1402, Nov. 2002.

* cited by examiner

*Primary Examiner*—Edward Wojciechowicz
(74) *Attorney, Agent, or Firm*—Scully, Scott, Murphy & Presser, P.C.; Vazken Alexanian

(57) ABSTRACT

The present invention provides a semiconducting structure including a substrate having an SOI region and a bulk-Si region, wherein the SOI region and the bulk-Si region have a same or differing crystallographic orientation; an isolation region separating the SOI region from the bulk-Si region; and at least one first device located in the SOI region and at least one second device located in the bulk-Si region. The SOI region has an silicon layer atop an insulating layer. The bulk-Si region further comprises a well region underlying the second device and a contact to the well region, wherein the contact stabilizes floating body effects. The well contact is also used to control the threshold voltages of the FETs in the bulk-Si region to optimized the power and performance of circuits built from the combination of the SOI and bulk-Si region FETs.

15 Claims, 5 Drawing Sheets

US 7,605,429 B2

HYBRID CRYSTAL ORIENTATION CMOS STRUCTURE FOR ADAPTIVE WELL BIASING AND FOR POWER AND PERFORMANCE ENHANCEMENT

FIELD OF THE INVENTION

The present invention relates to semiconductor devices, and more particularly to integrated semiconductor devices, such as complementary metal oxide semiconductor (CMOS) devices formed atop a substrate having thin silicon-on-insulator (SOI) and bulk-Si portions, wherein the SOI and bulk-Si portions of the substrate have either the same or different crystalline orientation. In particular, the present invention forms nFET and pFET devices on SOI and bulk-Si regions of a semiconducting substrate having either a surface on a (100), (110), or (111) crystal plane. The bulk-Si region of the substrate is processed to provide devices substantially free of floating body effects that are typically present in the devices formed with SOI substrates. Additionally, in the bulk regions a well contact can be utilized to control the threshold voltage (Vt) of the bulk NFET and pFET devices for improved circuit power and performance.

BACKGROUND OF THE INVENTION

Silicon-on-insulator (SOI) devices offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of "latchup," which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

Optimization of chip power and performance is becoming increasingly challenging as CMOS technologies are scaled to the 90 nm node and beyond. One technique employed in conventional bulk CMOS is adaptive well biasing. The technique of adaptive well biasing is disclosed, for example, in J. Tschanz, et al., J. Solid State Circuits, 2002, p. 1396. This technique involves varying and selecting optimal biases on the NFET well or body (p-well) node, the pFET well or body (n-well) node, and the power supply (Vdd) node to maximize the power and performance on a per chip basis. In SOI CMOS, this technique is not available as the well nodes (bodies) are floating. In principal, body tie structures may be employed in SOI CMOS to add a contact to the floating body node. The use of body ties structures, however, introduces parasitic resistances and capacitances which would negate the favorable impact of adaptive well biasing.

A recent innovation, hybrid orientation CMOS technology (HOT) uses both SOI nFETs and pFETs and conventional bulk nFETs and pFETs. HOT technology is described, for example, in M. Yang, et al., IEDM 2003, p. 453. and U.S. application Ser. No. 10/250,241, filed Jun. 17, 2003, entitled High-Performance CMOS SOI Devices on Hybrid Crystal Oriented Substrates. Additionally, the same or different crystallographic orientations can be used for NFET and pFET devices. The use of different crystallographic orientations allows for independently optimizing the performance of an nFET (which in silicon has highest mobility and performance in the (100) orientation) and the pFET (which in silicon has the highest mobility and performance in the (110) orientation). Additionally, it is known within the art, that NFET devices formed atop a (110) crystal plane have decreased carrier mobility and switching speed.

There is thus a need to provide an integrated semiconducting device in which a HOT substrate and adaptive well biasing are both implemented to provide a structure that has power and performance enhancement.

SUMMARY OF THE INVENTION

The present invention provides a semiconductor structure that includes incoporating field effect transistors (FETs) on a SOI substrate region having a device channel capable of being either partially or fully depleted of charger carriers in combination with FETs within a bulk-Si region having a highly doped well body contact which substantially eliminates floating body effects and provides a means to use adaptive well biasing thereby providing a means to control the threshold voltages of the bulk-Si regions FETs with an applied bias on the well terminal.

Specifically, the present invention combines a modification of the HOT structure disclosed in M. Yang, et al., IEDM 2003, p. 453, whereby a highly doped well is created and contacted for one device type. This provides the means for then applying a bias to implement the adaptive well biasing technique for the device placed in the conventional bulk CMOS region. Additionally, because the well is unipolar, there are no well to well leakage or capacitance penalties for implementing the adaptive well biasing, which is a major advantage over the conventional bulk CMOS scheme for adaptive well biasing.

Broadly, the present invention provides a semiconducting structure that comprises:

a substrate comprising an SOI region and a bulk-Si region, wherein said SOI region and said bulk-Si region have a same or differing crystallographic orientation;

an isolation region separating said SOI region from said bulk-Si region;

at least one first device located in said SOI region and at least one second device located in said bulk-Si region; and a well region underlying said at least one second device and a contact to said well region, wherein said contact stabilizes floating body effects and provides a means for adjusting threshold voltages in field effect transistors (FETs) located in the bulk-Si region through application of a bias voltage.

In accordance with the present invention, the SOI region of the substrate comprises an SOI layer having a thickness that is capable of being either fully or partially depleted of charge carriers when the device is forward biased. The SOI region may include at least one NFET device, at least one pFET device, or combinations thereof. The bulk-Si region may include at least one nFET, pFET, resistor, capacitor, diode or a combination thereof.

The above structure can be provided by utilizing a method that includes wafer bonding, masking, etching and regrowth of a semiconductor layer. Specifically, the method of the present invention comprises the steps of providing a substrate comprising at least a first semiconductor layer and a second semiconductor layer separated by an insulating layer, said first semiconductor layer and said second semiconductor layer having a same or differing crystalline orientation; protecting a portion of the substrate to define an SOI region, while leaving another portion of the substrate unprotected, said unprotected portion of the substrate defining a bulk-Si region; etching said unprotected portion of the substrate to expose a surface of the second semiconductor layer; regrowing a semiconductor material on said exposed surface of the second semiconductor layer, said semiconductor material having said same crystalline orientation; planarizing the substrate containing the semiconductor material so that an upper surface of the first semiconductor layer is substantially planar with an upper surface of the semiconductor material; and forming at least one first device in said SOI region, while forming at least one second device on said semiconductor material in said bulk-Si region.

In accordance with the present invention, the second device within the bulk-Si region can be formed by implanting the bulk-Si region with a first type dopant to provide a well region, forming at least one gate region atop a surface of the bulk-Si region, forming source and drain regions adjacent at least one gate region with a second type dopant, and forming a contact to the well region, wherein the contact stabilizes floating body effects and provides a well contact which may be utilized for adjusting the threshold voltages of the devices in the bulk Si region. Forming the contact to the well region comprises etching a portion of the surface of the bulk-Si region to provide a via to the well region and filling the via to the well region with a conductive material.

DETAILED DESCRIPTION OF THE INVENTION

Figure 1A:
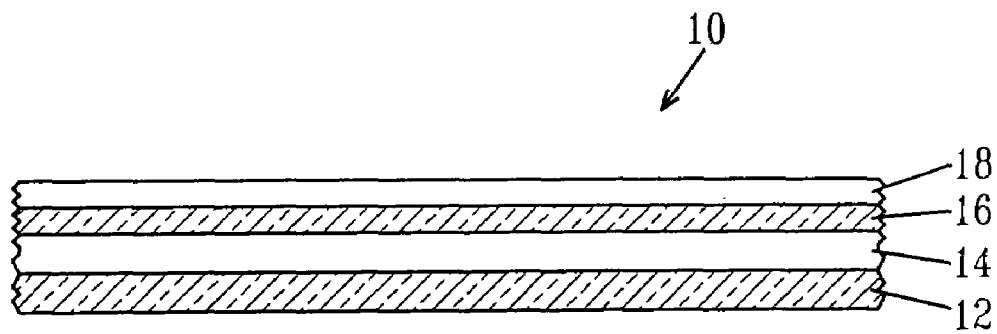
FIGS. 1A-1F are pictorial representations (through cross sectional views) illustrating the basic processing steps used in forming a CMOS device containing high performance SOI channel MOSFET semiconductor devices having body contacts.

The present invention, which provides a hybrid crystal orientation CMOS structure for adaptive well biasing and power/performance enhancement, will now be described in greater detail by referring to the following discussion as well as the drawings that accompany the present application. In the accompanying drawings, like and correspondence elements are referred to by like reference numerals. It is noted that the drawings of the present application are provided for illustrative purposes and thus they are not drawn to scale.

FIG. 1A illustrates a substrate 10, i.e., hybrid substrate, which may be employed in the present invention. As shown, the substrate 10 includes a surface dielectric layer 18, a first semiconductor layer 16, an insulating layer 14, and a second semiconductor layer 12.

The surface dielectric layer 18 of the substrate 10 is an oxide, nitride, oxynitride or other insulating layer that is either present in one of the initial wafers before bonding, or formed atop the first semiconductor layer 16 after wafer bonding by either a thermal process (i.e., oxidation, nitridation or oxynitridation) or by deposition. Notwithstanding the origin of the surface dielectric layer 18, the surface dielectric layer 18 has a thickness from about 3 nm to about 500 nm, with a thickness from about 5 nm to about 20 nm being more typical.

The first semiconductor layer 16 is comprised of any semiconducting material including, for example, Si, SiC, SiGe, SiGeC, Ge alloys, GaAs, InAs, InP as well as other III-V or II-VI compound semiconductors. First semiconductor layer 16 may also comprise an SOI layer of a preformed SOI substrate or a layered semiconductor such as, for example, Si/SiGe. In one preferred embodiment of the present invention, the first semiconductor layer 16 is a Si-containing semiconducting material. The first semiconductor layer 16 has the same or different crystalline orientation as the second semiconductor layer 12, preferably being in the (100) crystal plane. Although a (100) crystal orientation is preferred, the first semiconductor layer 16 may have a (111) crystal plane, (110) crystal plane or other crystal plane, so long as the first semiconducting layer 16 is not a Si-containing material that is subsequently processed to provide an NFET device on a (110) crystal plane.

The thickness of the first semiconductor layer 16 may vary depending on the initial starting wafers used to form the substrate 10. Typically, however, the first semiconductor layer 16 has an initial thickness from about 5 to about 100 nm, which is then thinned to a thickness of less than 40 nm. The thinning of the first semiconductor layer 16 is performed by planarization, grinding, wet etch, dry etch or any combination thereof. In a preferred embodiment, the first semiconductor layer 16 is thinned by oxidation and wet etching to achieve the desired thickness to provide the upper Si-containing layer of a thin silicon-on-insulator substrate for the purpose of the present invention.

The insulating layer 14 which is located between the first semiconductor layer 16 and the second semiconductor layer 12 has a variable thickness depending upon the initial wafers used to create the substrate 10. Typically, however, the insulating layer 14 has a thickness from about 1 nm to about 500 nm, with a thickness from about 1 nm to about 100 nm being more typical. The insulating layer 14 is an oxide or other like insulator material that is formed on one or both of the wafers prior to bonding.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III-V or II-VI compound semiconductors. Second semiconductor layer 12 may also comprise an SOI layer of a preformed SOI substrate or a layered semiconductor such as, for example, Si/SiGe. In a highly preferred embodiment of the present invention, the second semiconductor layer 12 is comprised of a Si-containing semiconducting material. The second semiconductor layer 12 has the same or differing crystalline orientation as the first semiconductor layer 16, preferably being in the (100) crystal plane. Although a (100) crystal orientation is preferred, the second semiconductor layer 12 may have a (111) crystal plane, (110) crystal plane or other crystal plane, so long as the second semiconducting layer 12 is not a Si-containing material that is subsequently processed to provide an nFET device on a (110) crystal plane.

The thickness of the second semiconductor layer 12 may vary depending on the initial starting wafers used to form the substrate 10. Typically, however, the second semiconductor layer 12 has a thickness from about 5 nm to about 200 nm, with a thickness from about 5 to about 100 nm being more typical.

Figure 2A:
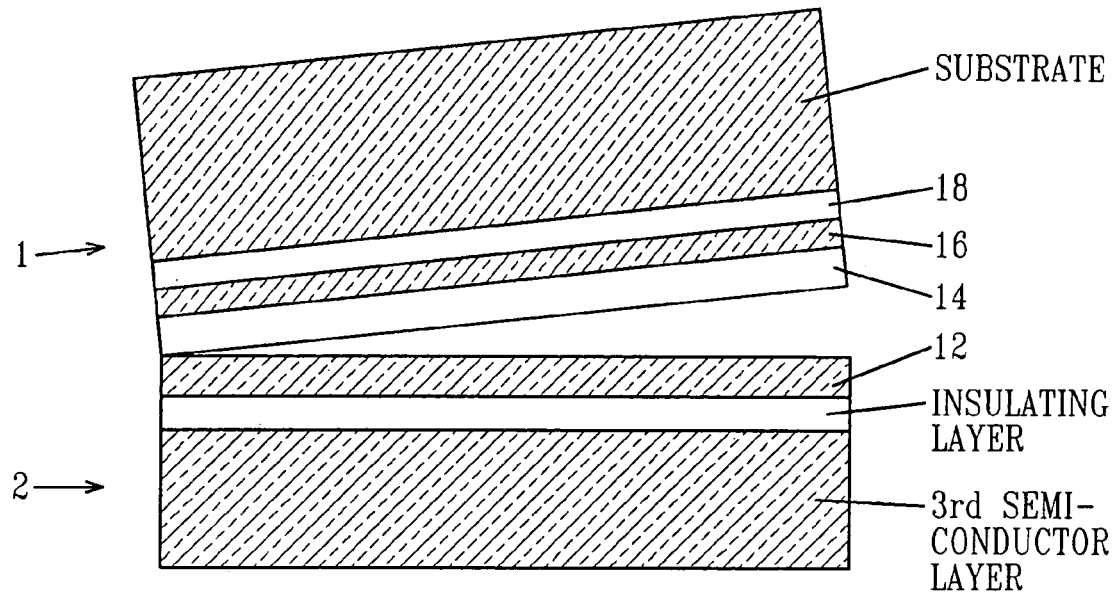
FIGS. 2A-2C are pictorial representations of various wafers that may be bonded together and used in the method described in FIGS. 1A-1F.
Figure 2B:
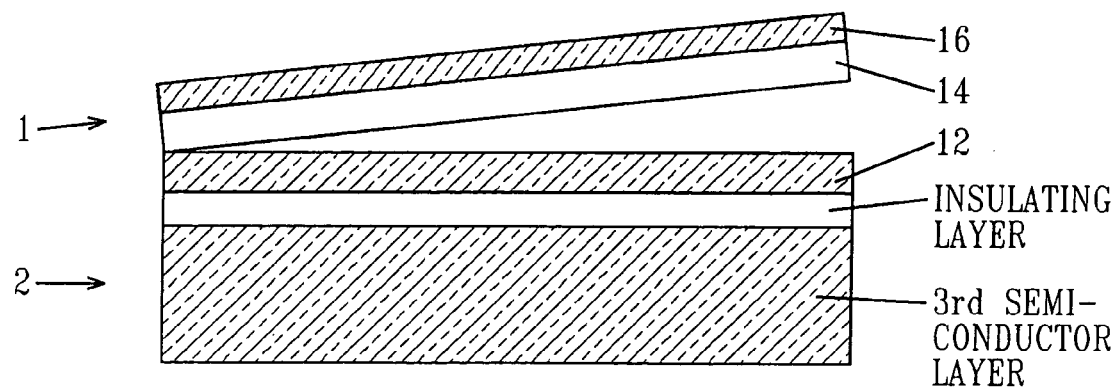
Figure 2C:
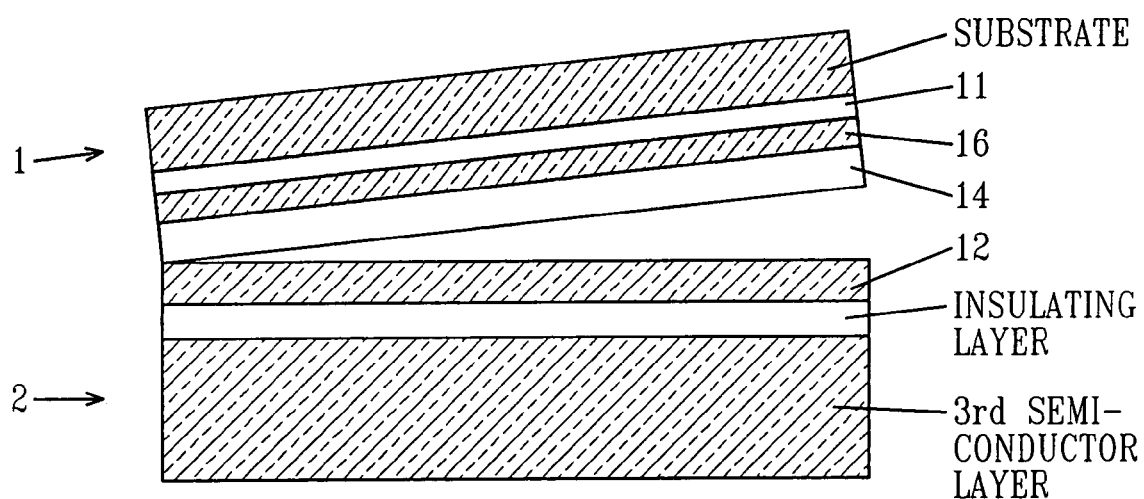

The substrate 10 illustrated in FIG. 1A is comprised of two semiconductor wafers that are bonded together. The two wafers used in fabricating the substrate 10 may include two SOI wafers (See, FIG. 2A), wherein one of the wafers, designated as 1, includes the first semiconductor layer 16 and the other wafer, designated as 2, includes the second semiconductor 12; an SOI wafer (designated as 2) and a bulk semiconductor wafer (designated as 1; See, FIG. 2B); or an SOI wafer (designated as 2) and a bulk wafer (designated as 1) which includes an ion implant region 11, such as a $H_2$ implant region, which can be used to split a portion of at least one of the wafers during bonding (See FIG. 2C).

Bonding is achieved by first bringing the two wafers into intimate contact with other, optionally applying an external force to the contacted wafers, and then heating the two contacted wafers under conditions that are capable of bonding the two wafers together. The heating step may be performed in the presence or absence of an external force. The heating step is typically performed in an inert ambient at a temperature from about 200° to about 1050° C. for a time period from about 2 to about 20 hours. More typically, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

In the embodiment where two SOI wafers are employed, some material layers of at least one of the SOI wafers may be removed after bonding utilizing a planarization process such as chemical mechanical polishing (CMP) or grinding and etching. The planarization process stops when surface dielectric layer 18 is reached.

In the embodiment in which one of the wafers includes an ion implant region, the ion implant region forms a porous region during bonding which causes a portion of the wafer above the ion implant region to break off leaving a bonded wafer such as is shown, for example, in FIG. 1A. The implant region is typically comprised of $H_2$ ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process, such as chemical vapor deposition (CVD), plasma-enhanced CVD, atomic layer deposition, chemical solution deposition as well as other like deposition processes.

Figure 1B:
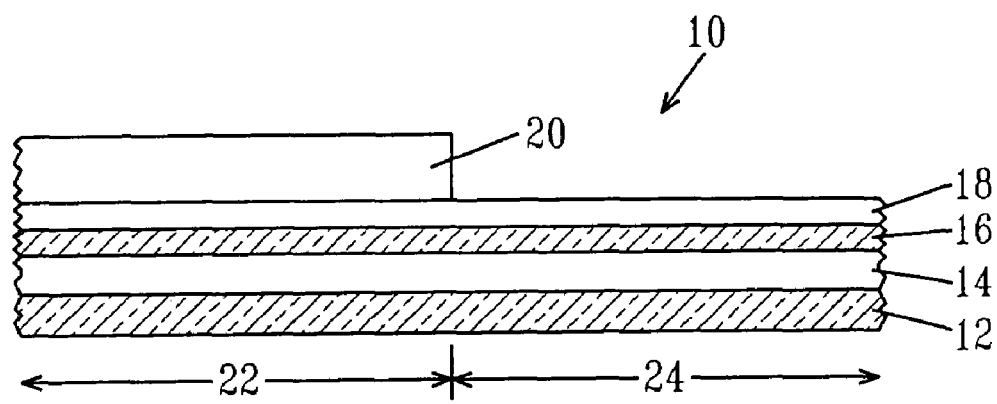

Referring now to FIG. 1B, a mask 20 is then formed on a predetermined portion of the substrate 10 of FIG. 1A so as to protect a portion of the substrate 10, while leaving another portion of the substrate 10 unprotected. The protected portion of the substrate 10 defines a SOI region 22 of the substrate, whereas the unprotected portion of the substrate 10 defines a bulk-Si region 24. In one embodiment, the mask 20 is formed on a predetermined portion of the surface dielectric layer 18 by applying a photoresist mask to the entire surface of the substrate 10. After application of the photoresist mask, the mask is patterned by lithography, which includes the steps of exposing the photoresist to a pattern of radiation and developing the pattern utilizing a resist developer. The resultant structure including the mask 20 formed on a predetermined portion of the substrate 10 is shown, for example, in FIG. 1B.

In another embodiment, the mask 20 is a nitride or oxynitride layer that is formed and patterned utilizing lithography and etching. The nitride or oxynitride mask 20 may be removed after defining the bulk-Si region 24 of the substrate 10.

After forming the mask 20 atop the substrate 10, the structure is subjected to one or more etching steps so as to expose a surface of the second semiconductor layer 12. Specifically, the one or more etching steps used at this point of the present invention removes the unprotected portions of the surface dielectric layer 18, as well as underlying portions of the first semiconductor layer 16, and a portion of the insulating layer 14 which separates the first semiconductor layer 16 from the second semiconductor layer 12. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18, the first semiconductor layer 16 and the insulating layer 14 in the bulk-Si region 24. The resultant structure after the etching process has been performed is shown, for example, in FIG. 1C. Note that the sidewalls of the protected SOI region 22, i.e., the surface dielectric layer 18, the first semiconductor layer 16 and the insulating layer 14, are exposed after this etching step. As shown, the exposed sidewalls of layers 18, 16 and 14 are aligned with an outer most edge of mask 20.

Figure 1C:
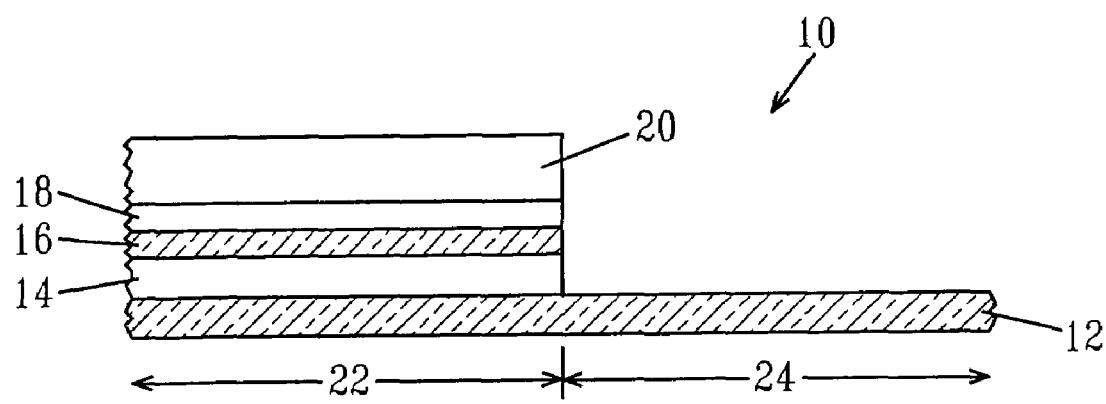

The mask 20 is then removed from the structure shown in FIG. 1C utilizing a conventional resist stripping process and then a liner or spacer 25 is typically, but not always, formed on the exposed sidewalls. The liner or spacer 25, which is optional, is formed by deposition and etching. The liner or spacer 25 is comprised of an insulating material such as, for example, an oxide.

After forming the optional liner or spacer 25, a semiconductor material 26 is formed on the exposed second semiconductor layer 12. In accordance with the present invention, semiconductor material 26 has a crystallographic orientation that is the same as the crystallographic orientation of the second semiconductor layer 12. The resultant structure is shown, for example, in FIG. 1D.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In the present invention, semiconductor material 26 may be referred to as a regrown semiconductor material 26.

Figure 1D:
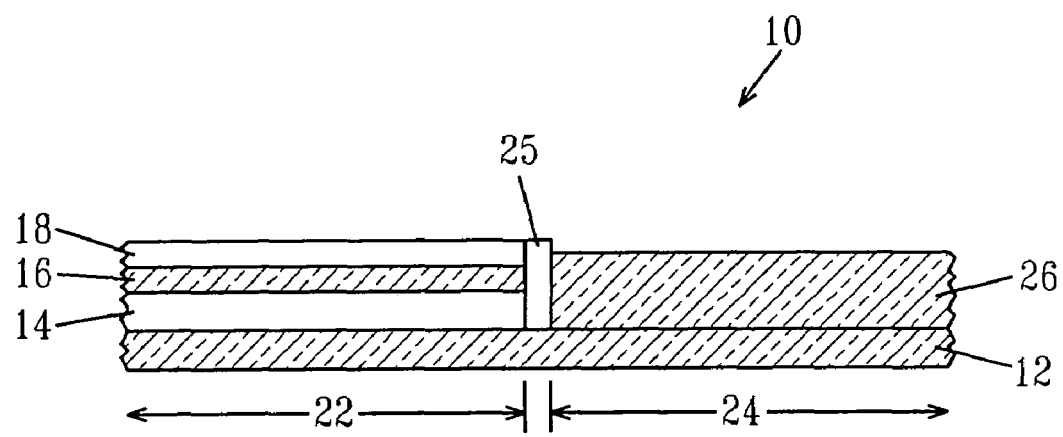

Next, the structure shown in FIG. 1D is subjected to a planarization process such as chemical mechanical polishing (CMP) or grinding such that the upper surface of the semiconductor material 26 is substantially planar with the upper surface of the first semiconductor layer 16. Note that previously protected portion of surface dielectric layer 18 is removed during this planarization process.

After providing the substantially planar surfaces, an isolation region 27, such as a shallow trench isolation region, is typically formed so as to isolate the SOI region 22 from the bulk-Si region 24. The isolation region 27 is formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification processing step may be performed to densify the trench dielectric.

Figure 1E:
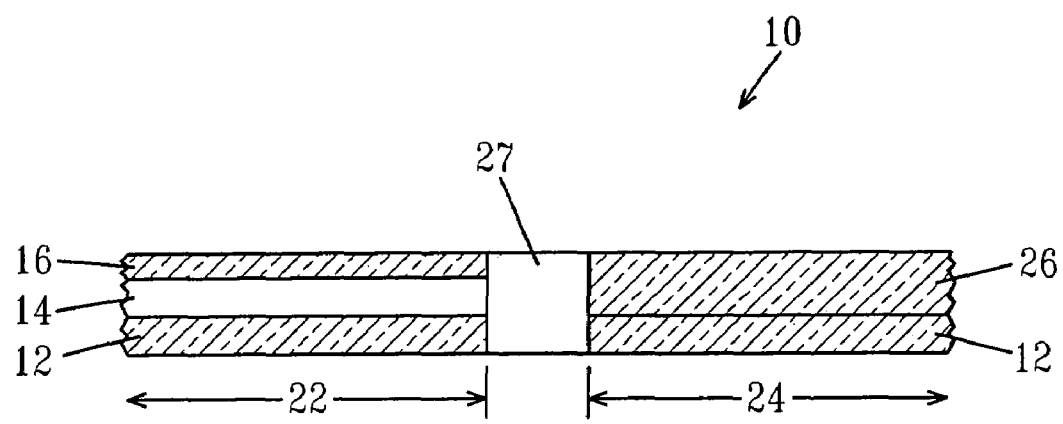

The resultant substantially planar structure containing isolation region 27 is show, for example, in FIG. 1E. As shown, the structure of FIG. 1E includes an exposed first semiconductor layer 16 within the SOI region 22 and the regrown semiconductor material 26 within the bulk-Si region 24, wherein the first semiconductor layer 16 and the semiconductor material 26 have the same or differing crystal orientation. In one preffered embodiment, layer 16 and layer 26 have the same crystal orientation. In that embodiment, it is highly preferably that layers 16 and 26 have a surface in the (100) crystal plane.

Figure 1F:
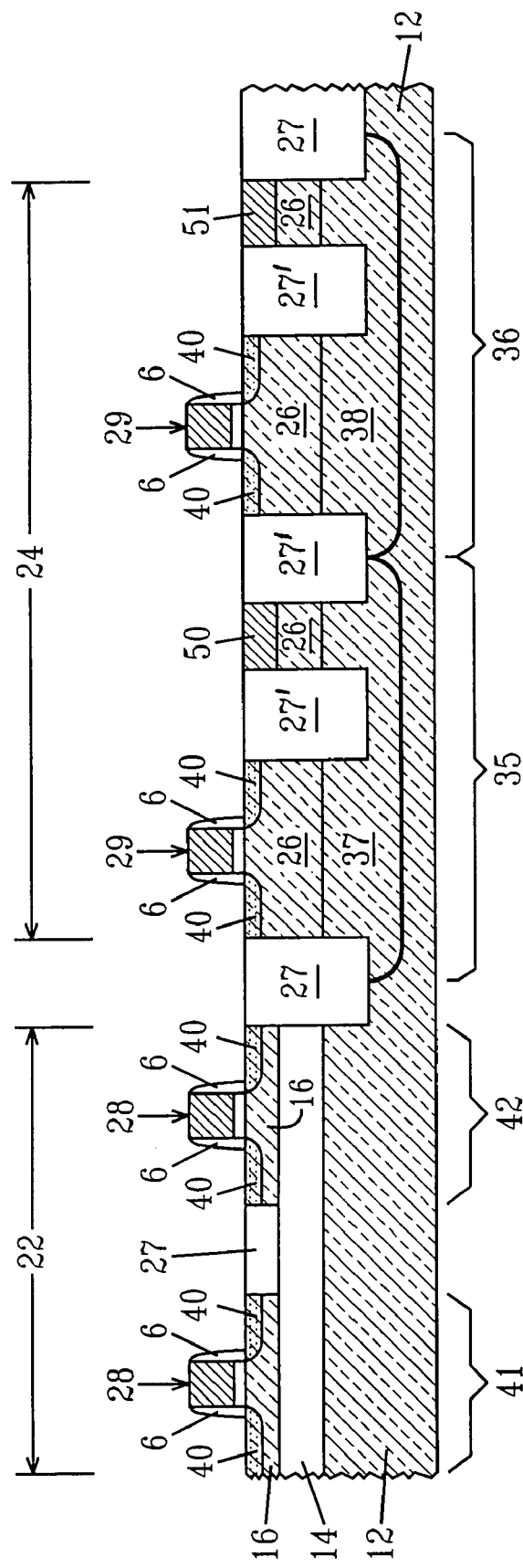

Referring to FIG. 1F, in a next process step, the SOI region 22 is processed to provide SOI MOSFETs and the bulk-Si region 24 is processed to provide devices having body contacts that substantially eliminate floating body effects and provide a means to adjust the threshold voltages of the FETs in the bulk-Si region 24.

Prior to processing the SOI region 22 and bulk-Si region 24, device isolation regions 27' may be formed within the substrate 10. Device isolation regions 27' can be provided by selectively etching trenches in the substrate utilizing a conventional dry etching process, such as reactive-ion etching (RIE) or plasma etching, in conjunction with conventional block masks. The device isolation regions 27' provide isolation within the bulk-Si region 24 and the SOI region 22 and are similar to the isolation region 27 that separates the bulk-Si region 24 from the SOI region 22. Alternatively, the device isolation regions 27' may be field isolation regions that are formed using a local oxidation of silicon process.

The SOI region 22 and the bulk-Si region 24 may be individually processed utilizing conventional block mask techniques. A block mask may comprise conventional soft and/or hardmask materials and can be formed using deposition, photolithography and etching. In a preferred embodiment, the block mask comprises a photoresist. A photoresist block mask can be produced by applying a blanket photoresist layer to the substrate 10 surface, exposing the photoresist layer to a pattern of radiation, and then developing the pattern into the photoresist layer utilizing a conventional resist developer.

Alternatively, the block mask can be a hardmask material. Hardmask materials include dielectrics that may be deposited by chemical vapor deposition (CVD) and related methods. Typically, the hardmask composition includes silicon oxides, silicon carbides, silicon nitrides, silicon carbonitrides and other like materials. Spin-on dielectrics may also be utilized as a hardmask material including, but not limited to: silsesquioxanes, siloxanes, and boron phosphate silicate glass (BPSG).

Well regions 37, 38 may be formed in the bulk-Si region 24 by selectively implanting p-type or n-type dopants into the bulk-Si region 24 of the substrate 10, wherein the SOI region 22 of the substrate 10 may be protected by a block mask, as described above. In the example depicted in FIG. 1F, a pFET bulk-Si region 35 is implanted to provide an n-type well 37 and an NFET bulk-Si region 36 is implanted to provide a p-type well 38.

The SOI layer may also be selectively implanted in the SOI region 22. In the example depicted by FIG. 1F, a pFET SOI region 41 is implanted to provide a n-type channel region and an NFET SOI region 42 is implanted to provide a p-type channel region.

Gate conductor stacks 28, 29 can then be formed within the SOI region 22 and bulk-Si region 24 by first blanket depositing a gate dielectric layer atop the substrate surface and then depositing a gate conductor layer atop the gate dielectric layer. The gate dielectric layer may comprise any conventional gate dielectric material, such as $SiO_2$, or any high-k gate dielectric material, such as $HfO_2$. The gate conductor layer may comprise any conductive material, such as doped polysilicon. The gate conductor and gate dielectric layer are then etched using conventional deposition, photolithography, and etching to provide gate conductor stacks 28, 29 within the SOI region 22 and bulk-Si region 24 of the substrate 10, as depicted in FIG. 1F. Alternatively, block masks may be used to provide the gate conductor stacks 28 within the SOI region 22 and the gate conductor stacks 29 within the bulk-Si region 24 separately.

In the embodiment depicted in FIG. 1F and during a next series of process steps, SOI MOSFET devices are then selectively formed within the SOI region 22, while the bulk-Si region 24 is protected by a hard or soft block masks. For example, a block mask provided by a patterned photoresist can be formed prior to implantation to preselect the substrate area within the SOI region 22 for gate conductor and/or source/drain diffusion region 40 doping with one dopant type. The block mask application and implantation procedure can be repeated to dope selected conductive material of gate conductor stacks 28, source/drain diffusion regions 40, source/drain extension regions or halo regions (not shown) with different dopant types, such as n-type or p-type dopant. After each implant, the block mask resist may be removed using conventional photoresist strip chemistries. In one preferred embodiment, the pattern and implant process steps may be repeated to provide at least one pFET device 41 and at least one nFET 42 device, in which the pFET and nFET devices 41, 42 are separated by isolation regions 27'.

Prior to implantation, spacers 6 are formed abutting the gate conductor stacks 28, wherein the width of the spacer may be adjusted to compensate for different diffusion rate of the p-type and n-type dopants. In addition, the pFET and NFET devices within the SOI region 22 may be processed to provide silicide regions or any other conventional structures typically utilized in ultra thin channel MOSFETS. Following the formation of the devices 41, 42 within the SOI region 22, the hardmask may be stripped from the bulk-Si region 24 and another hardmask is then formed atop the SOI region 22 of the substrate 10 leaving the bulk-Si region 24 exposed.

The bulk-Si region 24 can then be processed to provide devices having increased performance on a bulk-Si substrate, as opposed to a SOI substrate. For example, the bulk-Si region 24 may be processed to provide devices typically common in semiconductor manufacturing, such as resistors; capacitors, including decoupling capacitors, planar capacitors, and deep trench capacitors; diodes; and memory devices, such as dynamic random access memory (DRAM) and embedded dynamic random access memory (eDRAM). In a preferred embodiment, the bulk-Si region 24 comprises body contacts 50, 51. In one example, as depicted in FIG. 1F, the bulk-Si region 24 is processed to provide MOSFETs having body contacts 50, 51.

In the embodiment depicted in FIG. 1F, the bulk-Si region 24 is processed to provide at least one p-type MOSFET 35 and at least one n-type MOSFET 36 each having body contacts 50, 51, in which the p-type MOSFETs 35 are separated from the n-type MOSFETs 36 by device isolation regions 27'. Similar to the devices formed within the SOI region 22, the bulk-Si region 24 may be selectively implanted to provide p-type MOSFETs 35 and n-type MOSFETs 36 utilizing patterned block masks.

Following implantation, body contacts 50, 51 are then formed to at least one device within the bulk-Si region 24 of the substrate 10. The body contact 50, 51 to each MOSFET device 35, 36 within the bulk-Si region 24 is in electrical contact to the well region of the device and is separated from the MOSFET's source and drain regions 40 by an isolation region 26. Thus, as illustrated in FIG. 1F, only isolated body contacts 50, 51 are formed connecting to the MOSFETs within the bulk-Si region 24 while no body contacts at all are formed connected to the MOSFETs within the SOI region 22.

The body contacts 50, 51 may be formed using photolithography, etching, and deposition. More specifically, a body contact 50, 51 may be formed by patterning a portion of the substrate 10 within the bulk-Si region 24 and etching the exposed surface to form via holes to at least one well region 37,36 of at least one MOSFET 35, 36. The etch process can be a directional etch, such as reactive-ion etch. Following via formation, the body contacts 50, 51 are then formed by depositing a conductive material into the via holes using conventional processing, such as CVD or plating. The conductive material used in forming the body contacts 50, 51 may be doped polysilicon or a conductive metal. The conductive metal may include, but is not limited to: tungsten, copper, aluminum, silver, gold, and alloys thereof. In a preferred embodiment, the body contact 51 to the NFET SOI device 36 is p-type doped polysilicon and the body contact 50 to the pFET SOI device 35 is n-type doped polysilicon.

Note that the devices formed within the SOI region 22 and the devices formed within the bulk-Si region 24 of the substrate 10 are both formed atop surfaces having the same crystalline orientation. In one preferred embodiment, the devices within the SOI region 22 and the devices formed within the bulk-Si region 24 are both formed on a surface having a (100) crystal plane. In another preferred embodiment, the NFET and pFET devices within the SOI region 22 are formed on a surface having a (100) crystal plane and the pFET devices formed within the bulk-Si region 24 are both formed on a surface having a (110) crystal plane. In another preferred embodiment, the pFET devices within the SOI region 22 are formed on a surface having a (110) crystal plane and the NFET and pFET devices formed within the bulk-Si region 24 are both formed on a surface having a (100) crystal plane.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims

What is claimed is:

1. A semiconducting structure comprising:
    a substrate comprising a single crystal surface SOI region and a single crystal surface bulk-Si region;
    an isolation region separating said SOI region from said bulk-Si region;
    at least one first device located in said SOI region and at least one second device located in said bulk-Si region; and
    a well region underlying said at least one second device and a body contact to said well region located in said bulk-Si region located only in an area isolated from said at least one second device, wherein said body contact stabilizes floating body effects and provides a means for adjusting threshold voltages in field effect transistors (FETs) in the bulk-Si region through application of a bias voltage.

2. The semiconducting structure of claim 1 wherein said SOI region comprises an SOI layer atop an insulating layer, wherein said SOI layer has a thickness of less than about 40 nm.

3. The semiconducting structure of claim 1 wherein said at least one first device located in said SOI region comprises at least one nFET device, at least one pFET device, or combinations thereof.

4. The semiconducting structure of claim 1 wherein said at least one second device located in said bulk-Si region comprises at least one nFET, pFET, resistor, capacitor, diode or a combination thereof.

5. The semiconducting structure of claim 1 wherein said SOI region and said bulk-Si region each include a surface semiconductor material having a same crystal orientation that is selected from the group consisting of (100), (110), and (111).

6. The semiconducting structure of claim 1 wherein said SOI region and said bulk-Si region each have a surface semiconductor material having a differing crystal orientation that is selected from the group consisting of (100), (110), and (111).

7. The semiconducting structure of claim 1 wherein said bulk-Si layer and said SOI layer comprise a same or different silicon-containing material selected from the group consisting of Si, strained Si, SiGe, strained SiGe, SiC, SiGeC and combinations thereof.

8. A semiconductor structure comprising:
    a substrate comprising a single crystal surface SOI region and a single crystal surface bulk-Si region, wherein said SOI region and said bulk-Si region each include a surface semiconductor material having a same crystallographic orientation;
    an isolation region separating said SOI region from said bulk-Si region;
    at least one first device located in said SOI region and at least one second device located in said bulk-Si region; and
    a well region underlying said at least one second device and a body contact to said well region located in said bulk-Si region located only in an area isolated from said at least one second device, wherein said body contact stabilizes floating body effects and provides a means for adjusting threshold voltages in field effect transistors (FETs) in the bulk-Si region through application of a bias voltage.

9. The semiconductor structure of claim 8 wherein said SOI region comprises an SOI layer atop an insulating layer, wherein said SOI layer has a thickness of less than about 40 nm.

10. The semiconducting structure of claim 8 wherein said at least one first device located in said SOI region comprises at least one nFET device, at least one pFET device, or combinations thereof.

11. The semiconducting structure of claim 8 wherein said at least one second device located in said bulk-Si region comprises at least one nFET, pFET, resistor, capacitor, diode or a combination thereof.

12. The semiconducting structure of claim 8 wherein said same crystal orientation is (100), (110), or (111).

13. The semiconducting structure of claim 8 wherein said bulk-Si layer and said SOI layer comprise a same or different silicon-containing material selected from the group consisting of Si, strained Si, SiGe, strained SiGe, SiC, SiGeC and combinations thereof.

14. The semiconducting structure of claim 1 wherein the first device includes no body contact.

15. The semiconducting structure of claim 8 wherein the first device includes no body contact.

* * * * *

UNITED STATES PATENT AND TRADEMARK OFFICE
CERTIFICATE OF CORRECTION

PATENT NO. : 7,605,429 B2 Page 1 of 1
APPLICATION NO. : 11/107611
DATED : October 20, 2009
INVENTOR(S) : Bernstein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 188 days.

Signed and Sealed this

Fifth Day of October, 2010

David J. Kappos
*Director of the United States Patent and Trademark Office*